US 8,018,703 B2

(12) United States Patent
Chelloug

(10) Patent No.: US 8,018,703 B2
(45) Date of Patent: Sep. 13, 2011

(54) AUXILIARY DEVICE AND DATA TRANSMISSION METHOD, AUXILIARY UNIT AND ELECTRICAL CIRCUIT BREAKER COMPRISING SAID DEVICE

(75) Inventor: Mustapha Chelloug, Echirolles (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 727 days.

(21) Appl. No.: 11/987,062

(22) Filed: Nov. 27, 2007

(65) Prior Publication Data

US 2008/0136567 A1    Jun. 12, 2008

(30) Foreign Application Priority Data

Dec. 12, 2006  (FR) .................................. 06 10826
Dec. 18, 2006  (FR) .................................. 06 11009

(51) Int. Cl.
*H02H 3/08* (2006.01)
*H02H 9/02* (2006.01)

(52) U.S. Cl. .............. 361/93.2; 361/96; 361/97; 361/98

(58) Field of Classification Search ................ 361/93.2, 361/96, 97, 98
See application file for complete search history.

(56) References Cited

U.S. PATENT DOCUMENTS

| 5,231,565 | A  | * | 7/1993  | Bilas et al. ...................... 700/22 |
| 6,195,243 | B1 | * | 2/2001  | Spencer et al. .................. 361/64 |
| 6,288,647 | B1 | * | 9/2001  | Yamano ........................ 340/630 |
| 6,362,578 | B1 | * | 3/2002  | Swanson et al. .............. 315/307 |
| 6,459,363 | B1 | * | 10/2002 | Walker et al. .................. 375/238 |

FOREIGN PATENT DOCUMENTS

EP     0 591 074     4/1994

* cited by examiner

*Primary Examiner* — Rexford N Barnie
*Assistant Examiner* — Zeev Kitov
(74) *Attorney, Agent, or Firm* — Steptoe & Johnson LLP

(57) ABSTRACT

An auxiliary device for remote data transmission having processing means comprising a first input to receive a first data item of a state of the circuit breaker, and at least one command output to command transmission of data. The processing means comprise:
  a second input to receive at least one second data item representative of an electrical fault or of an auxiliary command,
  identification means to identify the type of electrical fault, and
  initialization means of the at least one command output.
An auxiliary unit and a circuit breaker comprising the device. A method for implementing said device.

21 Claims, 13 Drawing Sheets

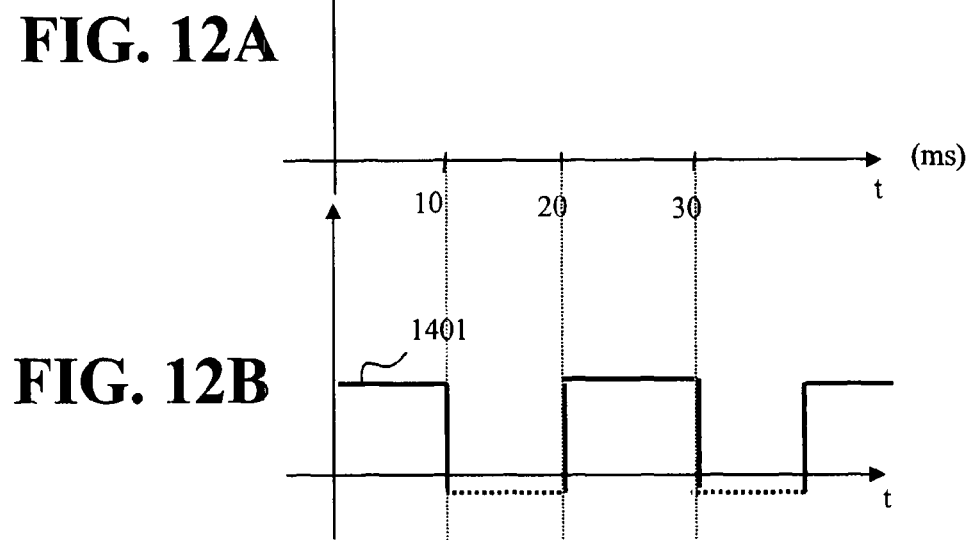
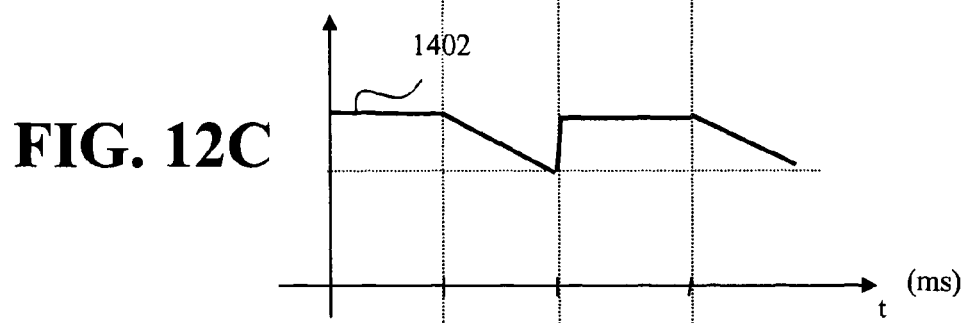
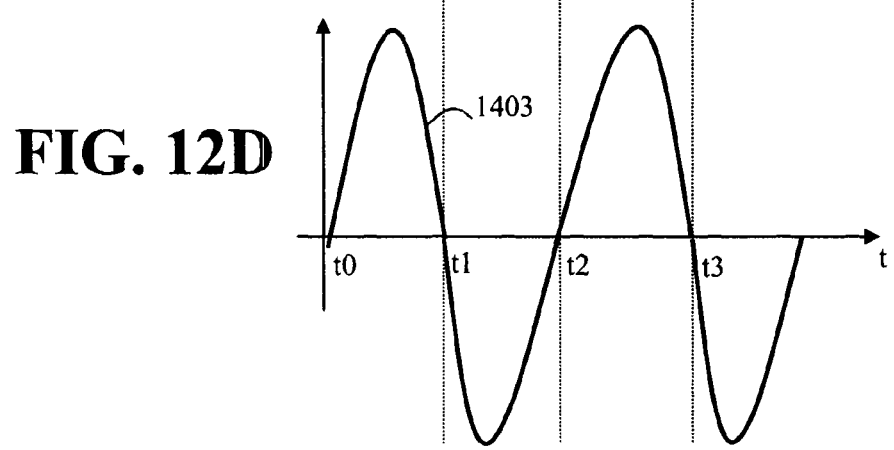

AUXILIARY DEVICE AND DATA TRANSMISSION METHOD, AUXILIARY UNIT AND ELECTRICAL CIRCUIT BREAKER COMPRISING SAID DEVICE

BACKGROUND OF THE INVENTION

The invention relates to an auxiliary data transmission device for a circuit breaker, said device comprising processing means comprising:
- a first input to receive, in at least one configuration, a first data item representative of a state of said circuit breaker, and
- at least one command output to command transmission of a data item.

The invention also relates to an auxiliary unit of an electrical circuit breaker comprising the auxiliary data transmission device.

The invention also relates to a circuit breaker comprising said auxiliary unit.

The invention finally relates to a data transmission method for a circuit breaker comprising:
- a read step, in at least one configuration, of a first data item representative of a state (O,C) of said circuit breaker, and
- a command step to command data transmission.

STATE OF THE ART

Patent application EP 0 591 074 describes an electrical circuit breaker comprising auxiliary units performing indication and/or control functions. One of the auxiliary units performs remote transmission of data representative of a state of the circuit breaker, in particular data representative of opening or closing of the main contacts of the circuit breaker.

The processing means of auxiliary data transmission devices of the prior art are generally initialized by means of the trip device signal data. Such a process is not optimized as far as dependability is concerned.

SUMMARY OF THE INVENTION

The object of the invention is to remedy the shortcomings of the methods and devices of the prior art by proposing an auxiliary data transmission device wherein the processing means comprise:
- a second input to receive at least one second data item representative of an electrical fault or an auxiliary command,
- identification means connected to the second input to identify the electrical fault in the second data item, and
- initialization means of the at least one command output to command transmission, in said configuration, of the data item representative of a state of said circuit breaker according to the first data item and the second data item.

Preferably, the identification means perform identification of an electrical fault selected from:
- electrical faults causing opening of the main contacts of the circuit breaker, and/or
- electrical faults not causing opening of the main contacts of the circuit breaker.

Advantageously, the electrical faults causing opening of the main contacts of the circuit breaker comprise thermal or differential faults, thermal faults, and differential faults. Advantageously, the electrical faults not causing opening of the main contacts of the circuit breaker comprise any frequency variation with respect to a reference, any voltage variation with respect to a reference, and any malfunction in the measuring channel.

Preferably, the signals carrying the second data item are in the form of a frame comprising a pulse having a duration that is representative of the data carried by said signals.

Preferably, the processing means comprise a configuration input.

Advantageously, in a configuration of fault indication transmission with initialization by change of state of the circuit breaker, the processing means:
- command transmission of the second data item when the second data item is representative of an electrical fault corresponding to a fault causing opening of the main contacts of the circuit breaker, and
- perform initialization of the at least one command output when the first data item is representative of subsequent closing of the main contacts of said circuit breaker.

Advantageously, in the configuration of fault indication transmission with initialization by change of state of the circuit breaker, the second data item is representative of an electrical fault of the thermal and/or differential type. Preferably, the auxiliary device allows to command data transmission on two static contacts enabling a data item representative of an electrical fault of thermal type and a data item representative of an electrical fault of differential type to be distinctively transmitted. Preferably, the processing means comprise time delay means associated with the initialization means to perform initialization when the time elapsed between transmission of the second data item and closing of the main contacts is less than a predetermined time delay, for example comprised between 300 and 700 ms.

Advantageously, in a configuration of fault indication transmission with initialization by means of the trip device of said circuit breaker, the processing means:
- command transmission of the second data item when the second data item is representative of an electrical fault, and
- perform initialization of the at least one command output when the second data item is representative of an auxiliary initialization command.

Advantageously, in a configuration of auxiliary command of an adjoined switch, the processing means:
- command transmission of the second data item when the second data item is representative of an auxiliary opening command of an adjoined switch, and
- perform initialization of the at least one command output when the second data item is representative of an auxiliary initialization command.

Preferably, in the configuration of auxiliary command of an adjoined switch, the auxiliary initialization command is delayed. Preferably, the auxiliary device comprises adjustment means of the time delay of the adjoined switch auxiliary opening command. Preferably, the first input is connected to the adjustment means to receive a data item representative of the time delay.

According to a preferred embodiment, the auxiliary device comprises coupling means with a trip device of said circuit breaker to receive signals carrying the second data item representative of an electrical fault or of an auxiliary command, the second input being connected to said coupling means. Preferably, the coupling means comprise an optic coupler and hermetic protection means.

According to a preferred embodiment, the auxiliary device comprises switching means comprising power outputs, said switching means being connected to the at least one command output to switch at least one static contact and to transmit at least one of said data items to said contact.

Preferably, the auxiliary device presents a standard form to be able to be fitted in at least one compartment of said circuit breaker.

In a particular embodiment:
the auxiliary device comprises at least one power semi-conductor module having a control input, a first output and a common second output, and a power supply circuit comprising at least one third supply voltage input and a polarization voltage output to control said control input of at least one semi-conductor module,
the power supply circuit supplies a polarization voltage on said polarization voltage output when there is a first voltage polarity between said third voltage input and said common output enabling a current flow, said power supply comprising a fourth supply voltage input connected to said common output of the power semi-conductor modules, and means for supplying a supply voltage to a control circuit supplying control signals of said modules,
the at least one power semi-conductor module comprises current blocking means to block a current flow from the power supply circuit when there is a second polarity opposite to the first polarity between said third input and said common output, and means for storing electrical polarization energy to command turn-on of said power semi-conductors during power supply circuit current blocking, and
it comprises means for changing reference line to change the reference line of control signals between a first input signal reference line and a second reference line dependent on the polarization voltage output.

Preferably, each module comprises a rectifier bridge having two AC terminals corresponding to the outputs of the modules and DC terminals connected to power electrodes of an electronic power component, said current blocking means being formed by at least one diode of said rectifier bridge connected between a reference power electrode of the power semi-conductor and a common second output of the power semi-conductor module.

Preferably, each module comprises means for storing polarization voltage for command of power semi-conductors connected to a power semi-conductor control electrode.

The invention also relates to an auxiliary unit of an electrical circuit breaker comprising:
an auxiliary device as described in the above, and
means for transmitting the state of the circuit breaker separated from the auxiliary device and coupled to the first input of the latter.

Preferably, in the auxiliary unit, the means for transmitting the state of the circuit breaker comprise an electrical contact actuated by a mechanism of the circuit breaker. Advantageously, the means for transmitting the state of the circuit breaker are arranged in an electrical terminal block connected to the static contacts of said auxiliary device. Preferably, the electrical terminal block presents a standard form to be able to be fitted in at least one compartment of said circuit breaker.

The invention also relates to an electrical circuit breaker comprising an electronic trip device to bring about opening of main contacts of said circuit breaker in response to at least one type of electrical fault, and an auxiliary unit coupled with said electronic trip device, wherein said auxiliary unit is as described in the above, and wherein it is coupled with the trip device by means of coupling means of the auxiliary data transmission device of said auxiliary unit.

The invention relates to a method of transmitting data for a circuit breaker comprising:
a read step, in at least one configuration, of a first data item representative of a state of said circuit breaker, and
a command step to command transmission of data.

In the method of the invention, the processing step comprises:
a read step to receive at least one second data item representative of an electrical fault or of an auxiliary command,
an identification step to identify an electrical fault (SD, SDT, SDV) in the second data item, and
an initialization step to command transmission, in said configuration, of the first data item representative of a state of said circuit breaker according to the first data item and the second data item.

Advantageously, in the configuration of fault indication transmission with initialization by change of state of the circuit breaker,
when the second data item is representative of an electrical fault corresponding to a fault causing opening of the main contacts of the circuit breaker, a transmission command of the second data item is sent to the command output, and
when the first data item is representative of subsequent closing of the main contacts of said circuit breaker, said command output is initialized.

Advantageously, in the configuration of fault indication transmission with initialization by change of state of the circuit breaker, the second data item is representative of an electrical fault of the thermal and/or differential type.

BRIEF DESCRIPTION OF THE DRAWINGS

Other advantages and features will become more clearly apparent from the following description of particular embodiments of the invention, given for non-restrictive example purposes only, and represented in the accompanying drawings.

FIGS. 12A to 12D illustrate signals present in a device according to an embodiment of the invention including electronic switching means.

DETAILED DESCRIPTION OF AN EMBODIMENT

Figure 1:
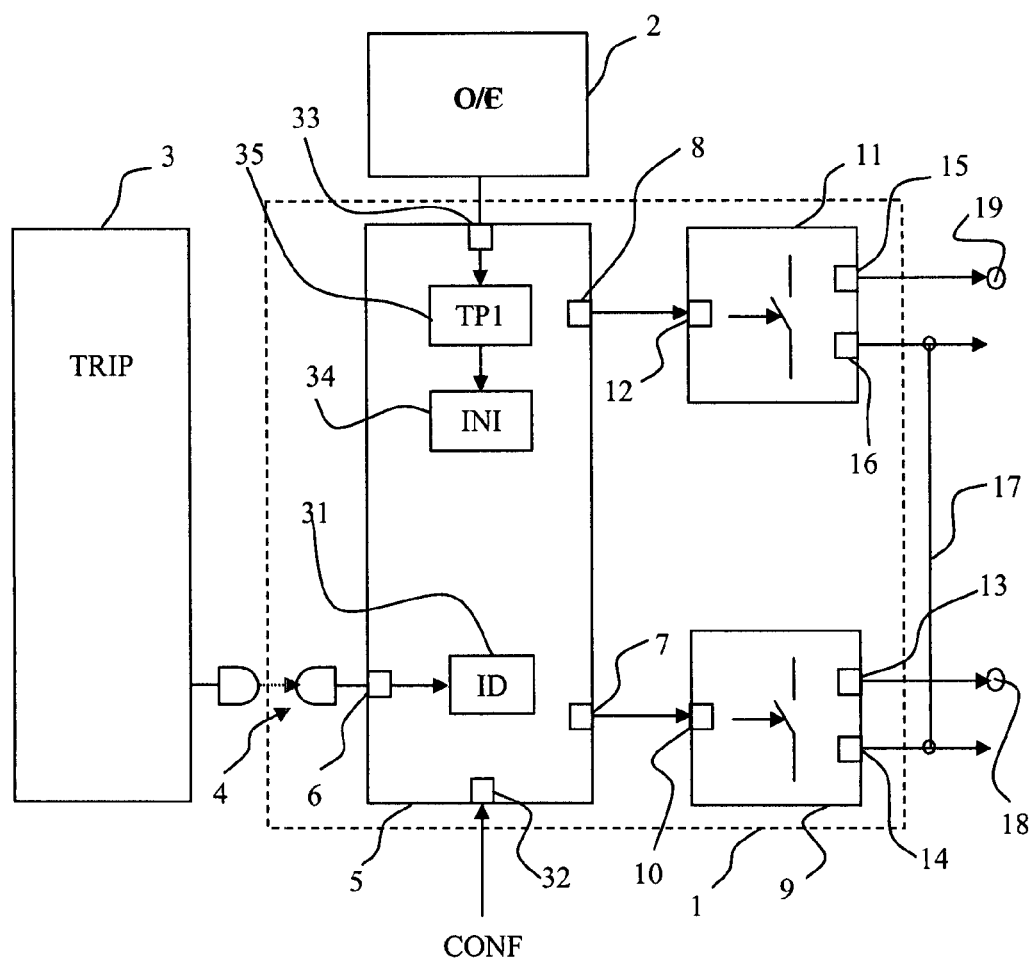
FIG. 1 represents a functional diagram of an auxiliary unit for a circuit breaker comprising an auxiliary data transmission device in a configuration of fault indication transmission with initialization by change of state of the circuit breaker.

The auxiliary unit represented in FIG. 1 comprises an auxiliary data transmission device 1 according to an embodiment of the invention enabling a data item representative of an electrical fault and/or of a circuit breaker state to be transmitted. The auxiliary unit also comprises remote state indication means 2 enabling the state of the circuit breaker, for example the open O or closed C state of the main contacts of the circuit breaker, to be transmitted. The auxiliary unit is coupled to a trip device 3 of the circuit breaker by means of the auxiliary device 1. The main function of the trip unit is to command opening of the main contacts of the circuit breaker in response to certain electrical faults.

The auxiliary data transmission device 1 of FIG. 1 comprises coupling means 4 with the trip device 3. These coupling means perform receipt of signals originating from the trip device and carrying at least a second data item representative of an electrical fault or an auxiliary command.

The auxiliary data transmission device 1 of FIG. 1 comprises processing means 5, the latter comprising a second input 6 connected to the coupling means 4. The processing means comprise at least one command output. In the embodiment represented in FIG. 1, the processing means 5 comprise two command outputs 7 and 8, each of said command outputs enabling, in the case of FIG. 1, transmission of the second data item or of a first data item representative of the state of the circuit breaker to be commanded. Generally, each output enables either transmission of the second data item representative of an electrical fault or transmission of the first data item representative of a circuit breaker state to be commanded, according to the state of the circuit breaker.

The auxiliary device 1 comprises switching means connected to the at least one command output. In the embodiment represented in FIG. 1, the switching means comprise a first power semi-conductor module 9 equipped with a command input 10 connected to the command output 7. The switching means also comprise a second power semi-conductor module 11 equipped with a command input 12 connected to the command output 8. The first power semi-conductor module 9 comprises a power output 13 and a common output 14. The second power semi-conductor module 11 comprises a power output 15 and a common output 16. The common outputs 14 and 16 of each module are connected to one another by a conductor 17. The switching means, and in particular the power semi-conductor modules 9 and 11 of said switching means, perform switching of at least one static contact and transmission of the second or first data item to said contact. In the embodiment represented in FIG. 1, the power output 13 of the first module 9 is connected to a first static contact 18, and the power output 15 of the second module 11 is connected to a second static contact 19. One of the static contacts can enable detection of a predetermined type of fault, for example a thermal fault SDT, to be transmitted, and the other static contact can enable detection of another predetermined type of fault, for example a differential fault SDV, to be transmitted. The difference of voltage level on a static contact enables the presence or absence of a predetermined type of fault to be indicated. In particular, a low voltage level or a zero voltage can correspond to the absence of the predetermined type of fault, whereas the presence of a high voltage level or of a voltage can correspond to the presence of this same type of fault. The static contacts 18 and 19 can be connected to display means, such as light-emitting diodes, to display the data transmitted to these contacts and to indicate the presence or not of certain types of faults.

The processing means 5 represented in FIG. 1 comprise identification means 31 connected to the second input to identify an electrical fault or an auxiliary command in the second data item. What is meant by identification of an electrical fault is identification of the presence of an electrical fault, whatever the type of fault. What is meant by identification of an electrical fault is also identification of the presence of a predetermined type of fault. The identification means can therefore identify an electrical fault selected from:

- electrical faults causing opening of the main contacts of the circuit breaker, for example thermal or differential faults SD, thermal faults SDT, and differential faults SDV, and/or
- electrical faults not causing opening of the main contacts of the circuit breaker, for example any frequency variation with respect to a reference, any voltage variation with respect to a reference, and any malfunction in the measuring channel.

When the auxiliary device is used in certain configurations, the identification means also enable an auxiliary command in the second data item to be identified. The auxiliary command can for example be an auxiliary initialization command or an auxiliary command to deactivate the at least one command output or an auxiliary command to open an adjoined switch.

The signals carrying the second data item can be in the form of a frame comprising pulses having a duration that is representative of the data carried by said signals. In this case, the identification means enable the duration of these pulses to be determined and to be compared with different values corresponding to preset data.

A configuration corresponding to an operating mode of the auxiliary device can be selected by means of the configuration input 32 of the processing means 5. The embodiment represented in FIG. 1 corresponds to a SDX configuration of fault indication transmission with initialization by change of the circuit breaker state. However, other configurations can be selected via the configuration input, such as a M2C configuration of fault indication transmission with initialization by means of the trip device of said circuit breaker, or a SDTAM configuration of auxiliary command of an adjoined switch.

The processing means 5 represented in FIG. 1 comprise a first input 33 to receive the first data item representative of a state of said circuit breaker, in a SDX configuration of fault indication transmission with initialization by change of the circuit breaker state. The processing means 5 also comprise initialization means 34 of the command output to command transmission, in this same SDX configuration, of the first data item representative of a state, according to the second data item and the first data item. In the SDX configuration of fault indication transmission with initialization by change of state of the circuit breaker, the processing means 5 can, in a first stage, advantageously command transmission of the second data item when the second data item is representative of an electrical fault corresponding to a fault causing opening of the main contacts of the circuit breaker and, in a second stage, perform initialization of the command output when the first data item is representative of subsequent closing of the main contacts of said circuit breaker. The second data item is generally representative of an electrical fault of the thermal type SDT and/or of the differential type SDV. In the mode represented in FIG. 1, the two command outputs 7 and 8 command data transmission via the switching means 9 and 11 to two static contacts 18 and 19 to distinctively transmit data of a thermal electrical fault SDT and data of a differential electrical fault SDV. Such an auxiliary data transmission device presents an enhanced dependability due to the fact that initialization is triggered by data representative of the circuit breaker state and that this data originates from state transmission means detached from the trip device.

The processing means can also comprise time delay means 35 associated with the initialization means to enable initialization of the command output when the time elapsed between transmission of the second data item and closing of the main contacts is less than a preset time delay. The time delay can range from 500 ms to 1 second, preferably from 300 to 700 ms. This time delay guarantees that the circuit breaker has indeed changed state before reinitializing, which enables for example the problem of bounce in the contact to be overcome.

Figure 2:
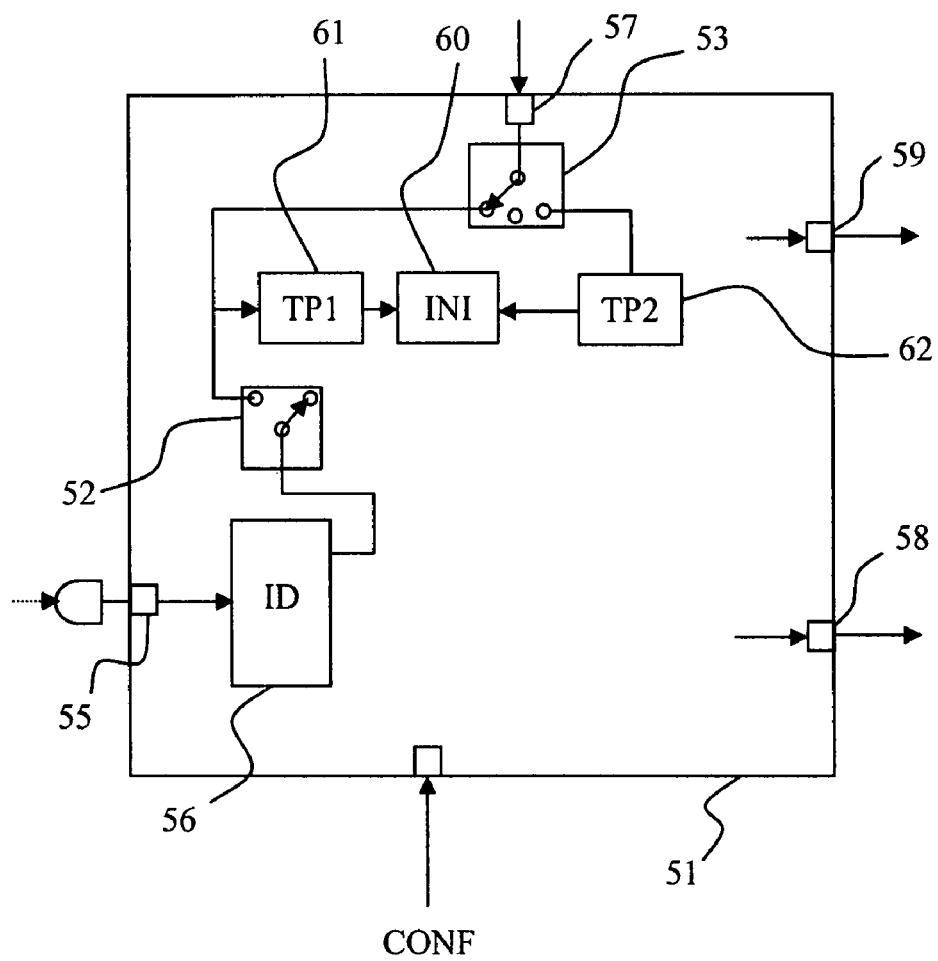
FIG. 2 represents a functional diagram of the processing means comprising means enabling different configurations to be selected corresponding to given operating modes.

The processing means 51 represented in FIG. 2 comprise selection means enabling a configuration corresponding to a given operating mode to be selected. These configuration selection means of FIG. 2 are represented in the form of a configuration interruption switch 52 and a configuration selector switch 53, for the purposes of illustrating the configuration change functionality. It is obvious that this switch and this configuration selector switch do not necessarily correspond to material elements identifiable as such in the processing means. The selection means represented in FIG. 2 enable configurations to be selected from:
- at least a SDX configuration of fault indication transmission with initialization by change of state of the circuit breaker,
- a M2C configuration of fault indication transmission with initialization by means of the trip device of said circuit breaker, or
- a SDTAM configuration of auxiliary command of an adjoined switch.

The processing means 51 represented in FIG. 2 comprise, as in FIG. 1, a second input 55, identification means 56 connected to the second input, a first input 57, two command outputs 58 and 59, initialization means 60 of the command outputs, and time delay means 61 associated with the initialization means. In addition to the elements enumerated above and already represented in FIG. 1 under different numerical references, the processing means 51 comprise elements dedicated to operation in the other two configurations—M2C and SDTAM. Among these elements, in a SDTAM configuration, time delay means 62 associated with the initialization means 62 enable initialization of at least one of the command outputs 58 and/or 59 to be delayed.

The configuration switch 52 and the configuration selector switch 53 of FIG. 2 are represented in states enabling a SDX configuration of fault indication with initialization by circuit breaker state change. In this SDX configuration, the configuration selector switch 53 is in a state enabling the first input 57 to be connected to the initialization means 60 by means of the time delay means 61. The first data item representative of an O or C state of said circuit breaker thereby enables initialization of the command outputs 58 and 59 to be commanded. The configuration switch 52 is for its part in an open state to disconnect the identification means from the initialization means. Thus, in this SDX configuration, the processing means, in a first stage, command transmission of the second data item available on the second input 55 when this data is representative of an electrical fault corresponding to a fault causing opening of the main contacts of the circuit breaker. These processing means also perform, in a second stage, initialization of the command outputs when the first data item available on the first input 57 is representative of subsequent closing of the main contacts of said circuit breaker and when the elapsed time between transmission of the second data item to the input 57 and closing of the main contacts is shorter than a preset time delay.

Figure 3A:
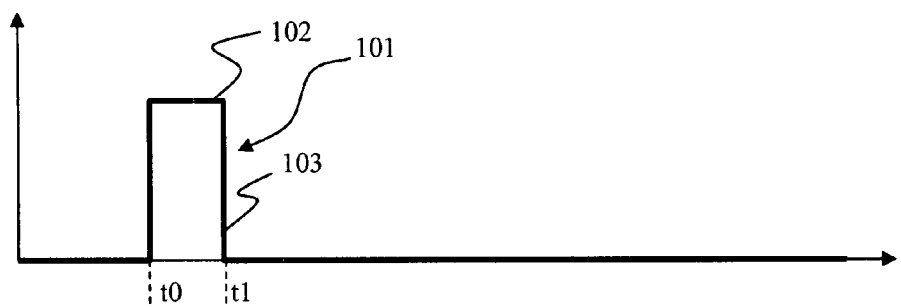
FIGS. 3a, 3b and 3c illustrate operation of the auxiliary device in a configuration of fault indication transmission with initialization by change of state of the circuit breaker and in the case of an opening time of the circuit breaker that is shorter than a time delay.
Figure 3B:
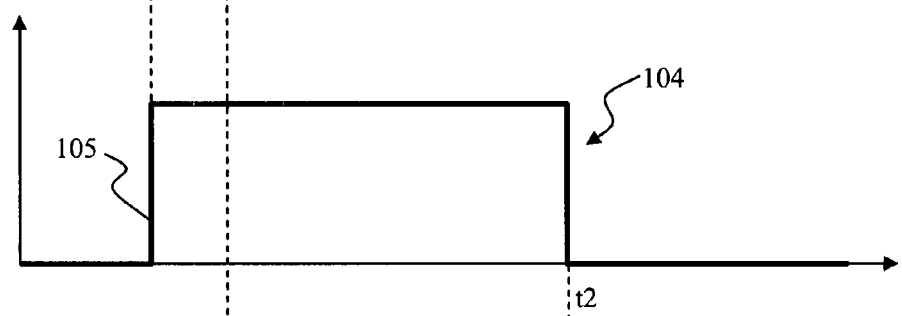
Figure 3C:
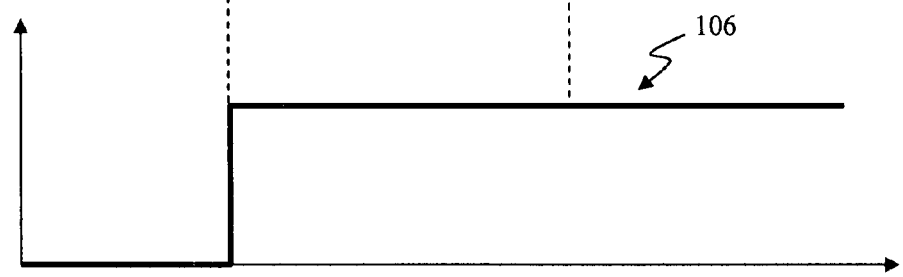

FIGS. 3a to 3c illustrate operation of the auxiliary device, in a SDX configuration, and when opening of the circuit breaker consecutive to an electrical fault extends over a time that is shorter than the time delay period. The signal 101 represented in FIG. 3a, received on the second input 55, carries a second data item representative of a fault, in this instance a predetermined type of fault. This signal comprises a pulse 102 the duration of which enables the predetermined type of fault to be identified, for example a thermal fault SDT or a differential fault SDV. The fault occurs at the time t0 and is identified at the time t1 or shortly after, i.e. at the earliest on the descending front 103 of the pulse 102. Moreover, the presence of this type of predetermined fault generates a change of state of the circuit breaker, i.e. opening of the main contacts, this data representative of a state being transmitted to the first input 57. Thus, as represented in FIG. 3b, the signal 104 received on the first input 57 comprises a rising front 105 representative of opening of the main contacts of the circuit breaker. This rising front 105 of the signal 104 can occur shortly after the time t0. The signal 104 is held at high level until the time t2 corresponding to closing of the main contacts of the circuit breaker. At the time t1, a transmission command of the second data item representative of the fault is sent to the command output 58 of the processing means. This second data item is then transmitted, via the switching means, to the static contact or one of the static contacts enabling the predetermined type of fault to be indicated. Thus the voltage 106 on this static contact, represented in FIG. 3c, goes at the time t1 from low level to high level to indicate the presence of a fault corresponding to the predetermined type of fault. As the time elapsed between t1 and t2 is shorter than the time delay of the time delay means 61, no initialization is performed and the voltage 106 on the static contact, represented in FIG. 3c, is held after the time t2 at high level. As the main contacts of the circuit breaker remained open for a shorter time than the duration of the time delay fixed by the time delay means 61, reinitialization of the command outputs is not performed. The problem of bounce in the contact is therefore overcome.

Figure 4A:
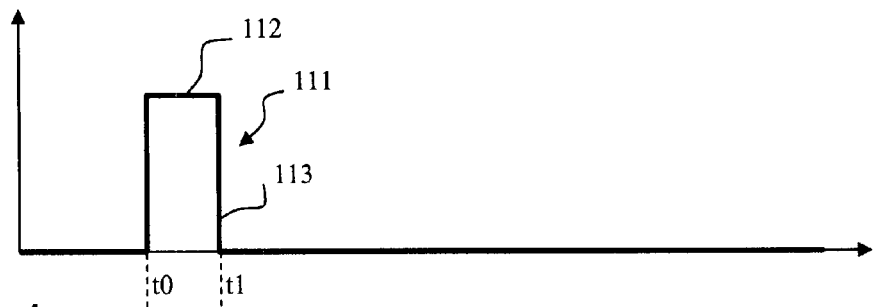
FIGS. 4a, 4b and 4c illustrate operation of the auxiliary device in a configuration of fault indication transmission with initialization by change of state of the circuit breaker and in the case of an opening time of the circuit breaker that is longer than the time delay.
Figure 4B:
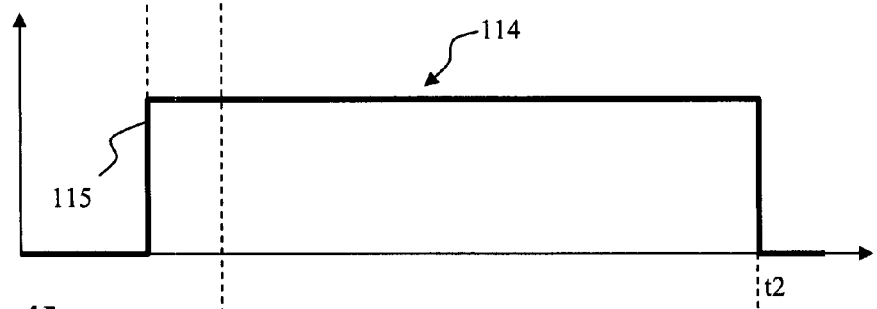
Figure 4C:
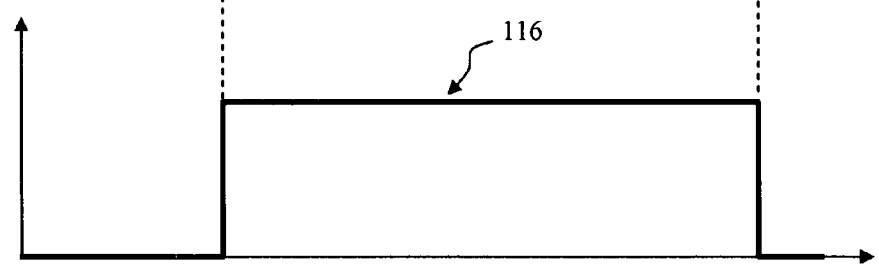

FIGS. 4a to 4c illustrate operation of the auxiliary device, in a SDX configuration, and when opening of the circuit breaker consecutive to an electrical fault extends over a longer time than the time delay. The signal 111 represented in FIG. 4a, received on the second input 55, comprises a pulse 112 the duration of which enables the predetermined type of fault to be identified, for example a thermal fault SDT or a differential fault SDV. The fault occurs at the time t0 and is identified at the time t1 or shortly after, i.e. at the earliest on the descending front 113 of the pulse 112. The signal 114 received on the first input 57 for its part comprises a rising front 115 representative of opening of the main contacts of the circuit breaker. Compared with FIG. 3b, the signal 114 of FIG. 4b is held at high level for a longer time, until a time t2 corresponding to closing of the main contacts of the circuit breaker. In the same way as in FIG. 3c, the voltage 116 on the static contact, represented in FIG. 4c, goes at the time t1 from low level to high level to indicate the presence of a fault corresponding to the predetermined type of fault. However, as the time elapsed between t1 and t2 is greater than the time delay, initialization of the command output is performed when the first data item is representative of subsequent closing of the main contacts. The voltage 116 on the static contact, represented in FIG. 3c, therefore goes after the time t2 from high level to low level. In SDX mode, reinitialization of the command outputs is only performed i) if the main contacts of the circuit breaker were open during at least the time delay of the time delay means 61, and ii) if these contacts were subsequently reclosed. The time delay means 61 thus ensure that reinitialization of the command outputs can be performed.

In a M2C configuration of fault indication transmission with initialization by means of the trip device of said circuit breaker, the configuration switch 52 is in a closed state and the selector switch 53 is in a state enabling the first input 57 to be fully disconnected, i.e. the first input is disconnected from the time delay means 61 and 62. In this M2C configuration, the processing means, in a first stage, command transmission of the second data item available on the second input 55 when the second data item is representative of an electrical fault, and in a second stage perform initialization of the command outputs when the second data item is representative of an auxiliary initialization command.

Figure 5A:
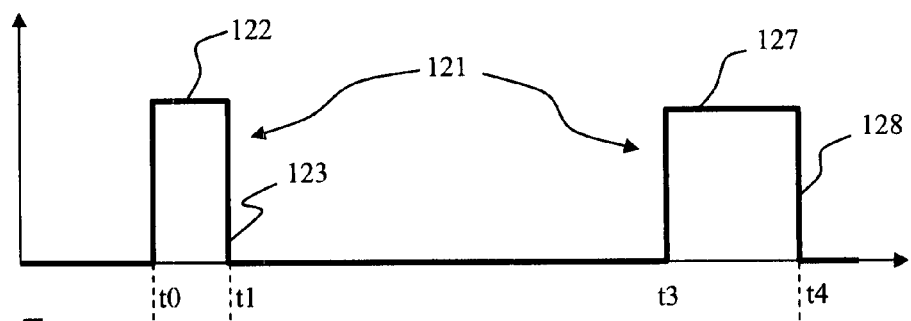
FIGS. 5a, 5b and 5c illustrate operation of the auxiliary device in a configuration of fault indication transmission with initialization by means of the trip device of said circuit breaker.
Figure 5B:
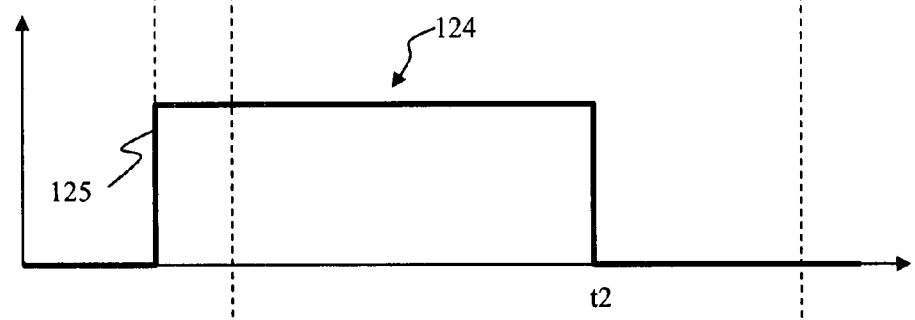
Figure 5C:
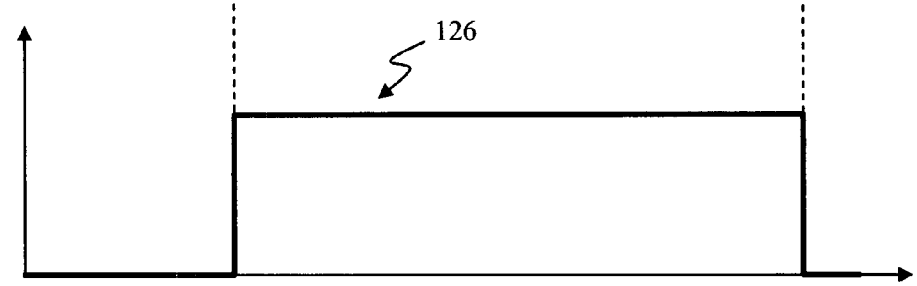

FIGS. 5a to 5c illustrate operation of the auxiliary device in a M2C configuration. The signal 121 represented in FIG. 5a, received on the second input 55, carries a second data item representative of a fault, i.e. the presence of a predetermined type of fault. This signal comprises a pulse 122 the duration of which enables the predetermined type of fault to be identified, for example a thermal fault SDT or a differential fault SDV or another type of fault, for example not causing opening of the main contacts of the circuit breaker. The fault occurs at the time t0 and is identified at the time t1 or shortly after, i.e. at the earliest on the descending front 123 of the pulse 122. Moreover, the presence of this predetermined type of fault in this particular case generates a change of state of the circuit breaker, i.e. opening of the main contacts. The data representative of opening of the main contacts is transmitted to the first input 57. Thus, as represented in FIG. 5b, the signal 124 received on the first input 57 comprises a rising front 125 representative of opening of the main contacts of the circuit breaker. This rising front 125 of the signal 124 can occur shortly after the time t0. The signal 124 is held at high level until the time t2 corresponding to closing of the main contacts of the circuit breaker. At the time t1, a transmission command of the second data item representative of the fault is sent to the command output 58 of the processing means. This second data item is then transmitted, via the switching means, to the static contact or one of the static contacts enabling the predetermined type of fault to be indicated. The voltage 126 on this static contact, represented in FIG. 5c, thus goes at the time t1 from low level to high level to indicate the presence of a fault corresponding to the predetermined type of fault. Unlike the SDX configuration, in the M2C configuration, initialization of the command output is not performed in response to subsequent closing of the main contacts. In the M2C configuration, initialization of the command output is performed when the second data item is representative of an auxiliary initialization command. As represented in FIG. 5a, this auxiliary initialization command is received on the second input 55 of the processing means at a time t3. Thus at the time t3, the signal 121 comprises the beginning of a pulse 127 the duration of which is different from that of the pulse 122 and which enables an auxiliary initialization command to be identified. As represented in FIG. 5c, initialization is performed at the time t4 or shortly after, i.e. on the descending front 128 of the pulse 127. The voltage 126 on the static contact, represented in FIG. 5c, goes from high level to low level after or shortly after the time t4. The M2C configuration enables the state of the circuit breaker not to be taken into account to reinitialize the command outputs and to preserve data transmission until an initialization order is received from the trip device via the coupling means.

In a SDTAM configuration of auxiliary command of an adjoined switch, the configuration switch 52 is in a closed state and the configuration selector switch 53 is in a state enabling the first input 57 to be connected to the time delay means 62. In the SDTAM configuration, the first input is used to supply a time delay. In this SDTAM configuration, the processing means, in a first stage, command transmission of the second data item available on the second input 55 when the second data item is representative of an auxiliary opening command of an adjoined switch, and in a second stage, perform initialization of the command outputs when the second data item is representative of an auxiliary initialization command. The transmission command of the second data item, when the latter is representative of an auxiliary command, enables opening of the main contacts of an adjoined switch to be remotely commanded by means of the static contacts. In this SDTAM configuration, the static contacts are connected to a command input of the adjoined switch by any coupling means known to the person skilled in the trade. The auxiliary initialization command is advantageously delayed by the time delay means 62, which enables the contacts of the adjoined switch to be reclosed and continuity of service of the installations protected by the circuit breaker to be ensured. The auxiliary device advantageously comprises adjustment means of the time delay of the auxiliary initialization command. In this case, an output of these adjustment means is connected to the first input 57. This first input thus receives data representative of the time delay of the time delay means 62.

Figure 6:
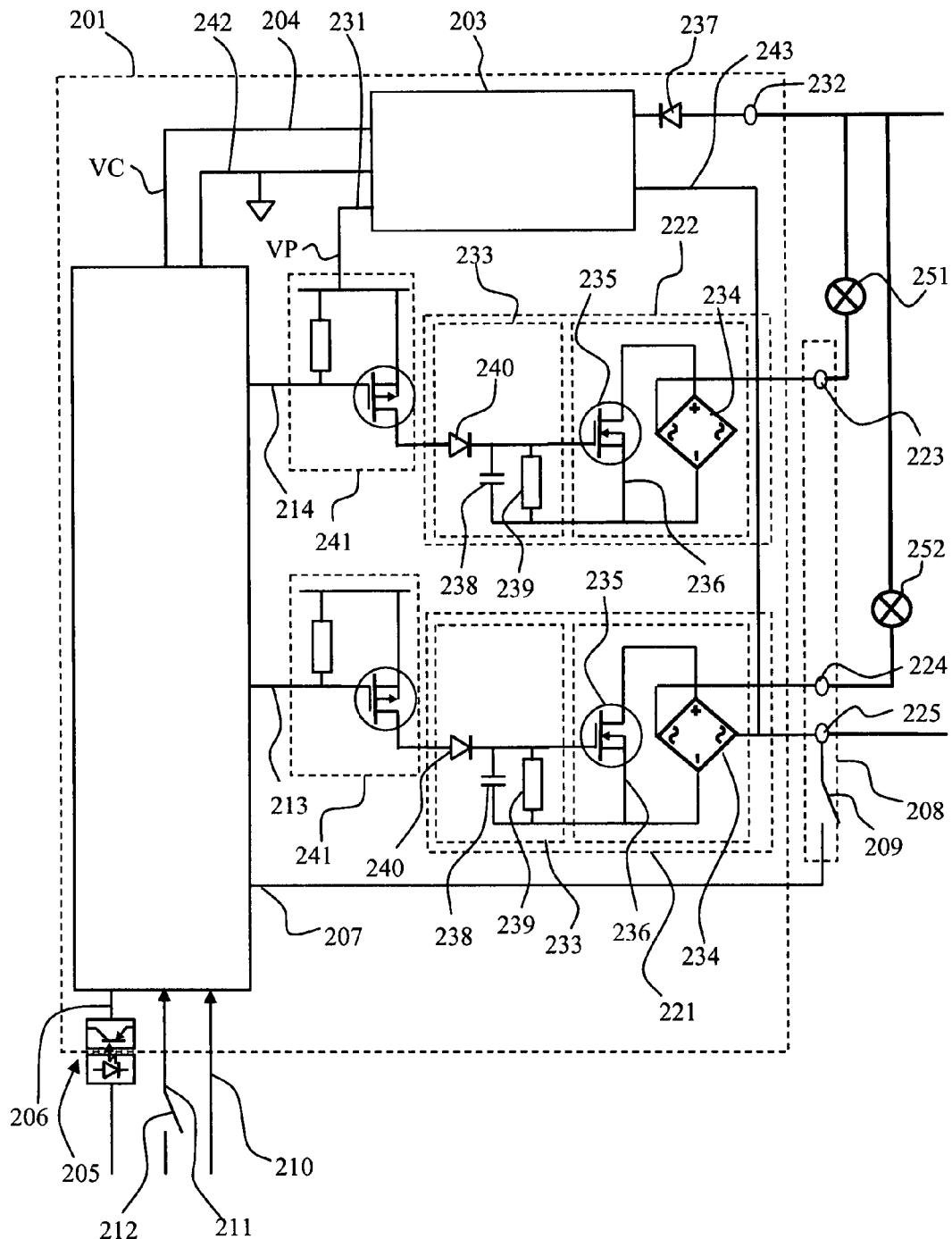
FIG. 6 represents a more detailed diagram of an embodiment of the auxiliary device according to the invention.

The auxiliary device 201 represented in FIG. 6 comprises a control circuit 202 and a power supply circuit 203 enabling, among other things, a supply voltage to be supplied to the control circuit via a conductor 204. In the embodiment represented in FIG. 6, the control circuit 202 comprises the processing means and comprises the elements described in the foregoing, such as the identification means and initialization means. A photocoupler 205 couples the processing means 202 with a trip device of the circuit via a second input 206 of said control circuit. The photocoupler 205 advantageously comprises at least one optic coupler and hermetic protection means. A first input 207 of said control circuit performs coupling with a terminal block 208 comprising transmission means of the state of the circuit breaker. More precisely, the first input 207 is designed to be connected with an electrical contact of a switch 209 of the state indication means in the terminal block 208, said contact being actuated by a mechanism of the circuit breaker. The second input 206 supplies the second data item representative of an electrical fault or of an auxiliary command, whereas the first input 207 supplies the first data item representative of an O or C state of the circuit breaker. The control circuit also comprises a control input 210 for configuration and an input 211 sensitive to an electrical contact 212 for global reinitialization. The control circuit 202 comprises two command outputs 213 and 214 to command transmission of a second data item received on the second input 206 or of a first data item received on the first input 207.

The auxiliary device 201 represented in FIG. 6 comprises switching means connected to the command outputs 213 and 214 of the control circuit 202. The switching means comprise a first power semi-conductor module 221 and a second power semi-conductor module 222. The first power semi-conductor module 221 comprises a common output and a power output connected to a second static contact 224. The second power semi-conductor module 222 comprises a common output and a power output connected to a first static contact 223. The two common outputs are generally connected to one another to be grouped in a main common output 225.

To avoid problems of disconnection of the power supply circuits, the power supply circuit 203 supplies a polarization voltage VP on a polarization voltage output 231 when a first polarity is present enabling a current flow between a power supply input 232 of the power supply circuit 203 and the main common output 225.

In this device, the power semi-conductor modules 221 and 222 comprise:
current blocking means to block a current flow when there is a second polarity opposite to the first polarity between the power supply input 232 and the main common output 225, and
polarization electrical power storage means 233 to command turn-on of the power semi-conductors of the modules 221 and 222 during current blocking of the power supply circuit 203.

Each module 221 and 222 comprises a rectifier bridge 234 formed by four diodes that are not represented. Each rectifier bridge 234 comprises two AC terminals corresponding to the power outputs of the modules 221 and 222 connected to the static contacts 223, 224 and 225, and DC terminals connected to power electrodes of an electronic power component 235. The current blocking means are formed by at least one diode, not represented, of each rectifier bridge 234 connected between a reference electrode 236 of the power semi-conductor 235 and the main common output 225. In this case, the polarization voltage VP is supplied by the power supply circuit when a positive voltage polarity is applied to the input 232 and a negative voltage polarity is applied to the second common output 225. The reference electrode 236 of the power semi-conductors 235 corresponds to the source or the emitter, depending on the type of power transistor used. The polarization electrical power storage means 233 for command of the power semi-conductor 235 are connected to a control electrode of said power semi-conductor. A diode 237 connected in series with the power supply input 232 of the power supply circuit 203 participates in turning the power supply off in case of a negative half-wave. The storage means are formed in this case by a RC circuit comprising a capacitor 238 and a resistor 239 connected in parallel and an antifeedback series diode 240. The capacitor stores a command electric power or voltage for a time that is predetermined by the values of the capacitor 237 and of the resistor 238. The storage means are referenced to the reference electrode 236 of the power semi-conductor 235, i.e. to the source or the emitter depending on the type of transistor used.

To improve control of the modules 221 and 222, the switching means of the auxiliary device represented in FIG. 6 comprise means 241 for changing reference line to change a control signal reference line between a first input signal reference line 242 and a second reference line dependent on the polarization voltage VP output 231. In the diagram of FIG. 6, circuits 241 change the control reference of the modules 221 and 222 by applying the voltage VP without being referenced to the reference line 242 of the control circuit 202. The circuits 241 thus perform electrical disconnection between the control circuit input reference line 242 and the common output 225.

The power supply circuit of the auxiliary device represented in FIG. 6 also comprises a second supply voltage input 243 connected to the main common output 225 of the power semi-conductor modules 221 and 222. The control circuit 202 is supplied by a supply voltage VC by means of the conductor 204. The command outputs 213 and 214 of the control circuit 202 supply command signals to the power semi-conductor modules 221 and 222 via the reference line change circuits 241. In the embodiment represented in FIG. 6, the reference lines 242 of the control circuit 202, of the polarization voltage VP, of the reference electrodes 236 of the power semi-conductors 235, and of the main common output 225 are at different electrical voltages.

In the auxiliary device represented in FIG. 6, display indicators 251 and 252 are respectively connected to the static contacts 223 and 224. Thus, the switching means, and in particular the modules 221 and 222, enable at least one of the static contacts 223 and 224 to be switched and the second or the first data item to be transmitted to said contact, which data being displayed by means of the indicators 251 and 252. One of the static contacts can transmit indication of a predetermined type of fault, for example a thermal fault SDT, and the other static contact can transmit indication of another predetermined type of fault, for example a differential fault SDV.

Figure 7:
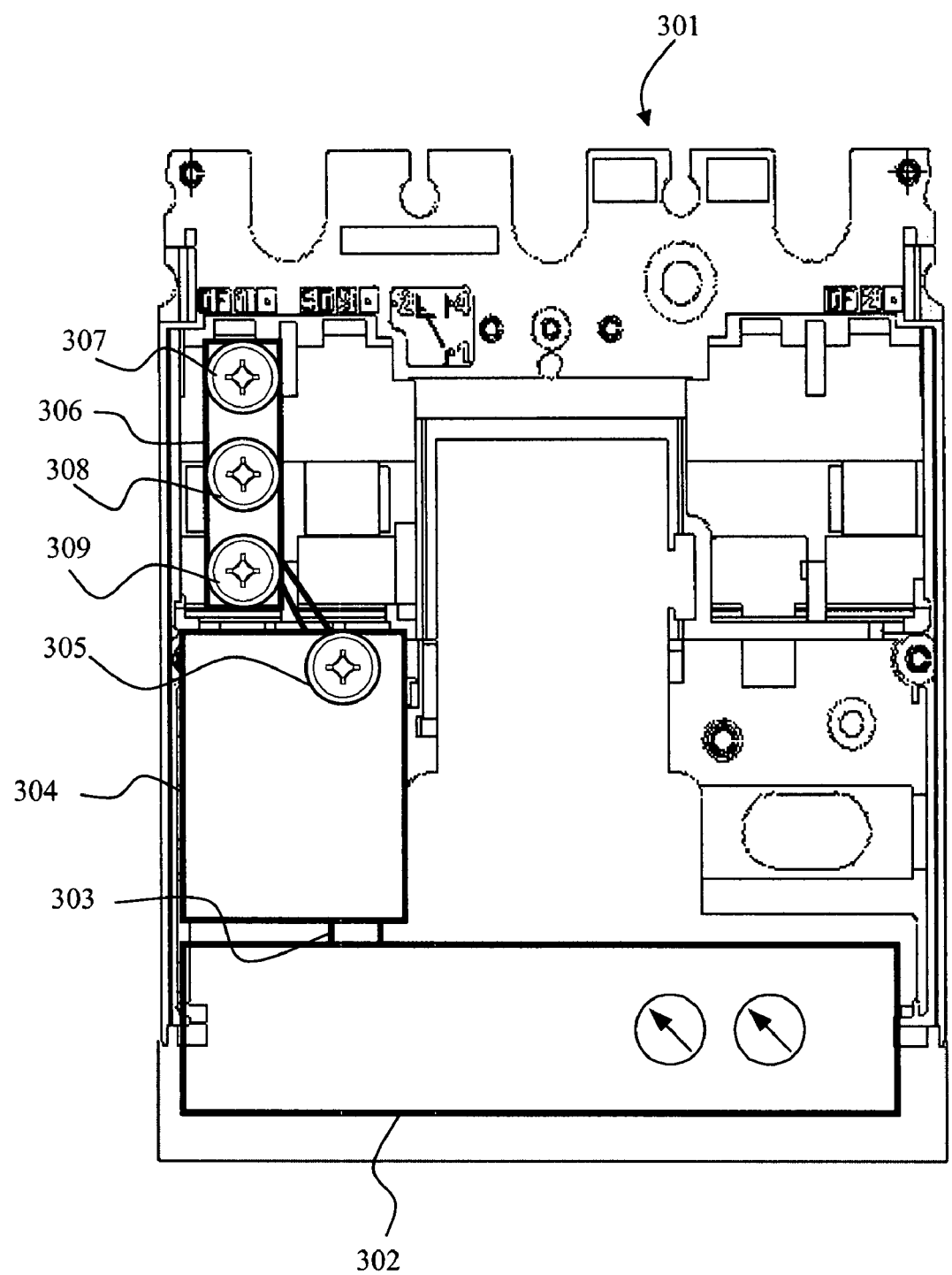
FIG. 7 represents an example of the front panel of a circuit breaker with its associated auxiliary unit comprising an auxiliary device and remote state indication means arranged in an electrical terminal block.

The electrical circuit breaker 301 represented in FIG. 7 comprises an electronic trip device 302 to trigger opening of the main contacts of said circuit breaker in response to at least one type of electrical fault. The circuit breaker also comprises an auxiliary unit according to an embodiment of the invention, said auxiliary unit being coupled to the trip device by means of the coupling means 303 of the auxiliary data transmission device 304 of said auxiliary unit. The auxiliary device 304 presents a standard form to be able to be fitted in a compartment of said circuit breaker and comprises a power supply input 305 of the power supply circuit, which is not represented. In addition to the auxiliary device, the auxiliary unit comprises means for transmitting the state of the circuit breaker that are separate from said auxiliary device and are arranged in a separate electrical terminal block 306 and connected to the static contacts of said auxiliary device. The electrical terminal block comprises static contacts 307 and 308 connected to the power outputs of the switching means of the auxiliary device and a static contact 309 connected to the main common output of said switching means.

Figure 8:
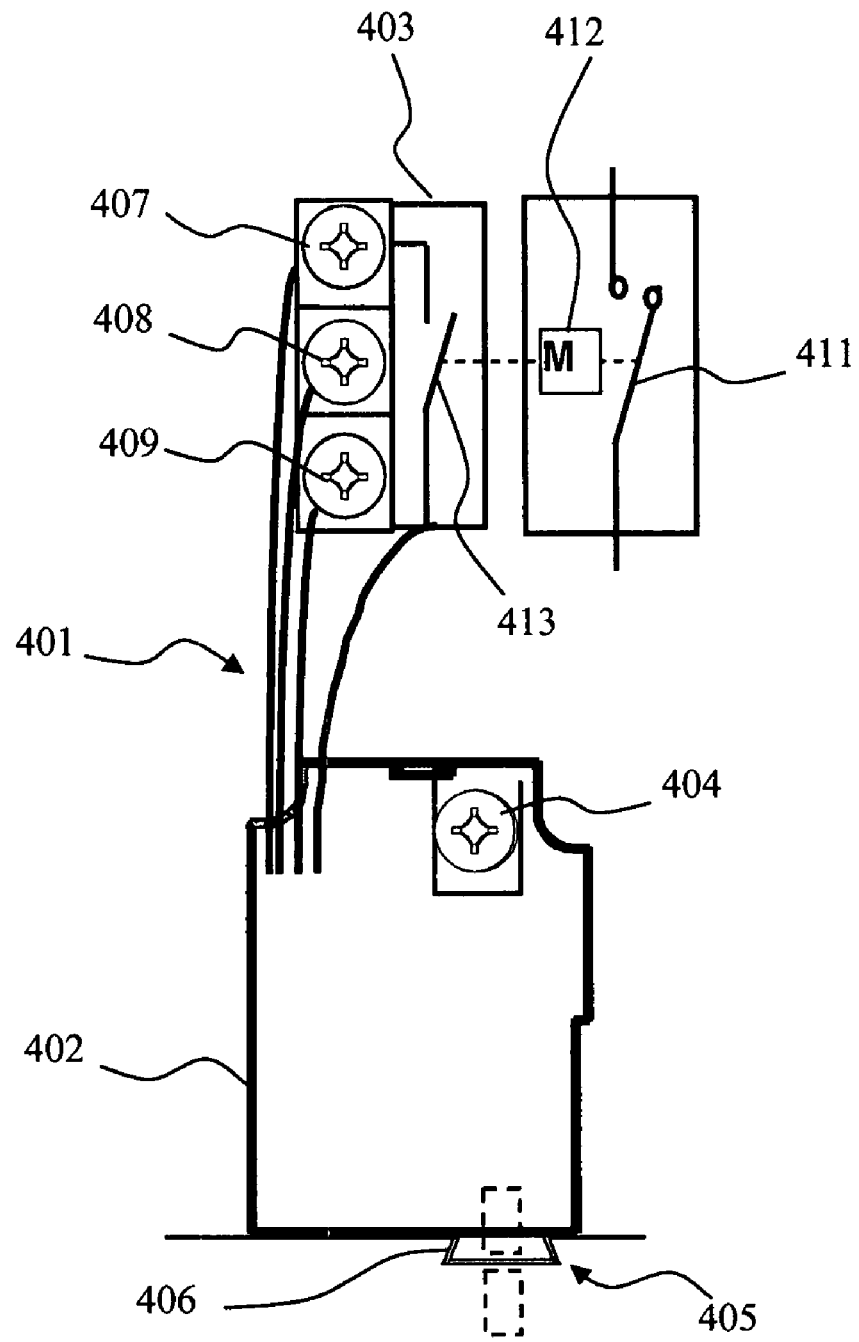
FIG. 8 represents a functional diagram of an example of an auxiliary unit according to an embodiment of the invention.

The auxiliary unit 401 represented in FIG. 8 comprises an auxiliary device 402 according to an embodiment of the invention and an electrical terminal block 403. The auxiliary device is of standard form to be able to be fitted in a compartment of the circuit breaker and comprises a power supply input 404 of the power supply circuit, which is not represented. The auxiliary device comprises a photocoupler 405 equipped with an optic coupler and hermetic protection means. To improve the protection and tightness of the link, the mechanical coupling is performed by a slider device 406 which can be in the form of a dovetail as represented or can have the form of slides and rectangular grooves. Such a protection of the optic connection prevents projections or fumes present when the circuit breaker breaks on very strong currents from disturbing the communication by optic beams. The electrical terminal block 402 comprises static contacts 407 and 408 connected to the power outputs of the auxiliary device switching means and a static contact 409 connected to the main common output of said switching means. FIG. 8 also represents in schematic manner the main contacts 411 of the circuit breaker and the mechanism 412 of said circuit breaker enabling an electrical contact 413 of the means for transmitting the state of the electrical terminal block to be actuated. The electrical contact is connected to the input of the auxiliary device processing means to receive the first data item representative of a state of said circuit breaker, i.e. opening or closing of said circuit breaker. Thus, the mechanism 412 enables opening and closing of the main contacts of the circuit breaker to be actuated and the first data item representative of state to be transmitted to the electrical contact 413.

Figure 9:
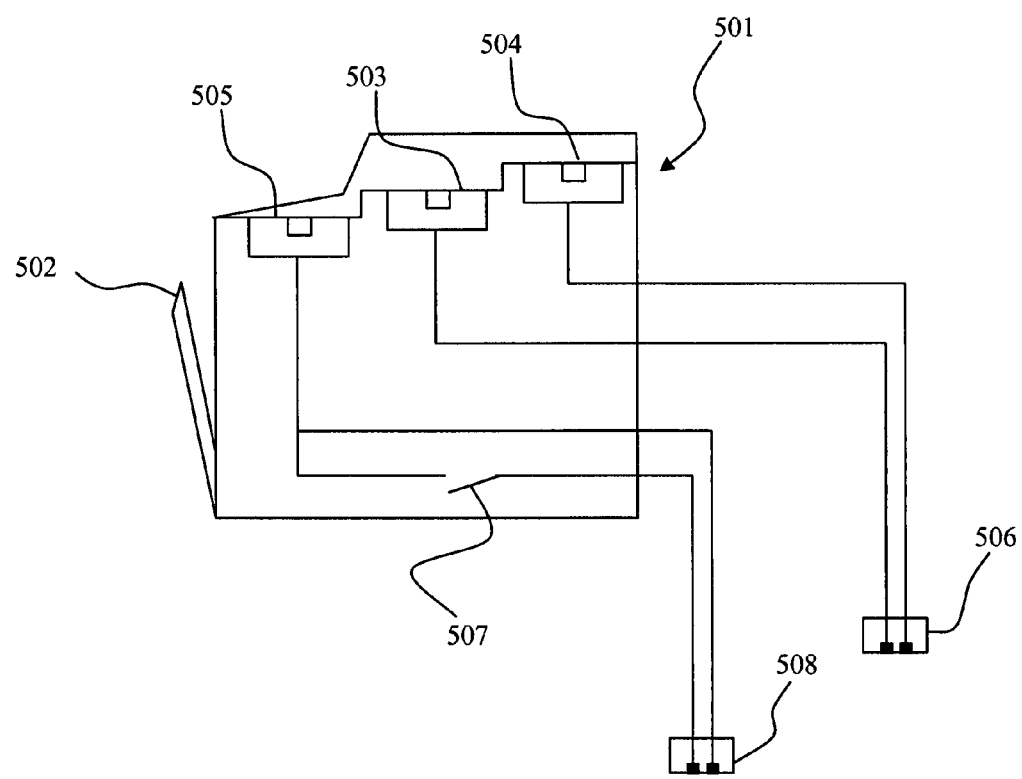
FIG. 9 represents an example of an electrical terminal block comprising the remote state indication means.

The electrical terminal block 501 of the auxiliary unit, represented schematically in FIG. 9, presents a standard form to be able to be fitted in at least one compartment of said circuit breaker by means of a fixing bracket 502. The electrical terminal block 501 comprises static contacts 503, 504 and 505. The static contacts 503 and 504 are designed to be connected to the power outputs of the auxiliary device switching means by means of a first connector 506. The electrical terminal block also comprises an electrical contact 507 actuated by a mechanism of the circuit breaker and connected to the static contact 505. A second connector 508 enables the static contact 505 to be connected to the main common output of said auxiliary device switching means, and the electrical contact 507 to be connected to the first input of the processing means of said auxiliary device.

Figure 10:
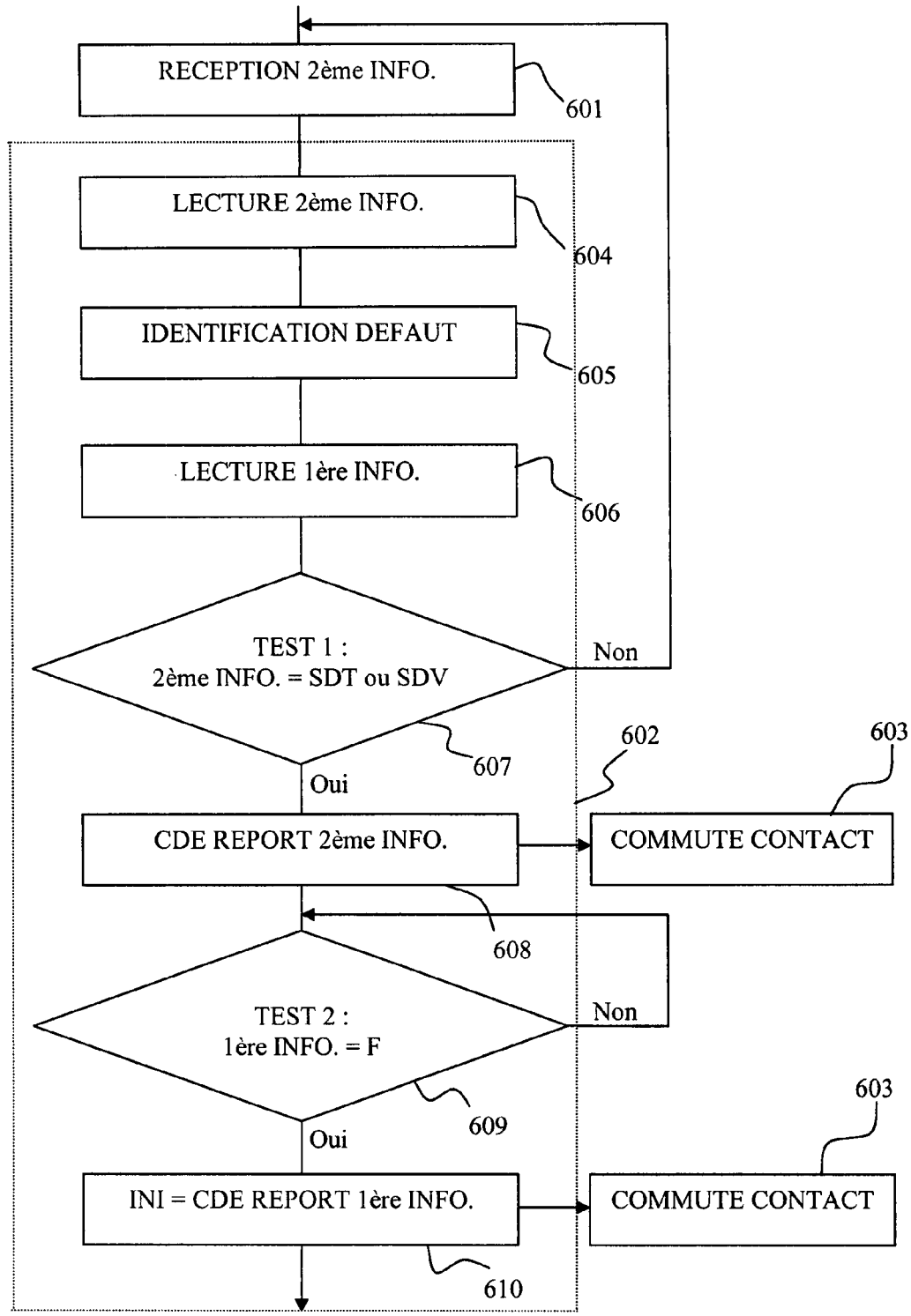
FIG. 10 represents an embodiment of the data transmission method according to the invention.

The algorithm of FIG. 10 represents the data transmission method according to a preferred embodiment of the invention. The method comprises:
a receipt step 601 to receive signals carrying at least one second data item representative of an electrical fault or of an auxiliary command,
a processing step 602 to read the second data item and to command transmission of said second data item to a command output or of a first data item representative of an 0 or C state of said circuit breaker, and
a switching step 603 to switch at least one static contact according to the command and to transmit at least one of said data items to said contact.

The processing step 602 itself comprises:
a read step 604 of the second data item representative of an electrical fault or of an auxiliary command,
an identification step 605 to identify the electrical fault SD, SDT or SDV in the second data item,
a read step 606, in a SDX configuration, of the first data item representative of an O or C state of said circuit breaker,
a test step 607 to determine whether, in said SDX configuration, the second data item is representative of an electrical fault corresponding to a SDT or SDV fault causing opening of the main contacts of the circuit breaker,
a command transmission step 608 of the second data item if the result of the test of step 607 is positive,
a test step 609 to determine whether, in said SDX configuration, the first data item is representative of subsequent closing of the main contacts of said circuit breaker, and
an initialization step 610 to command transmission of the first data item representative of a C state of said circuit breaker if the result of the test of step 609 is positive.

One advantage of the auxiliary state transmission device according to the invention is, in SDX mode, to enable the use of existing means, i.e. the state transmission means, to initialize the command output of the processing means.

Another advantage of the auxiliary state transmission device according to the invention is that, in SDX mode, command of initialization by means of the state transmission means is transmitted in dependable manner. Thus, the presence of an electrical fault is transmitted so long as the main contacts of the circuit breaker have not been reclosed.

Embodiment of an Auxiliary Device Including Electronic Switching Means

Figure 11:
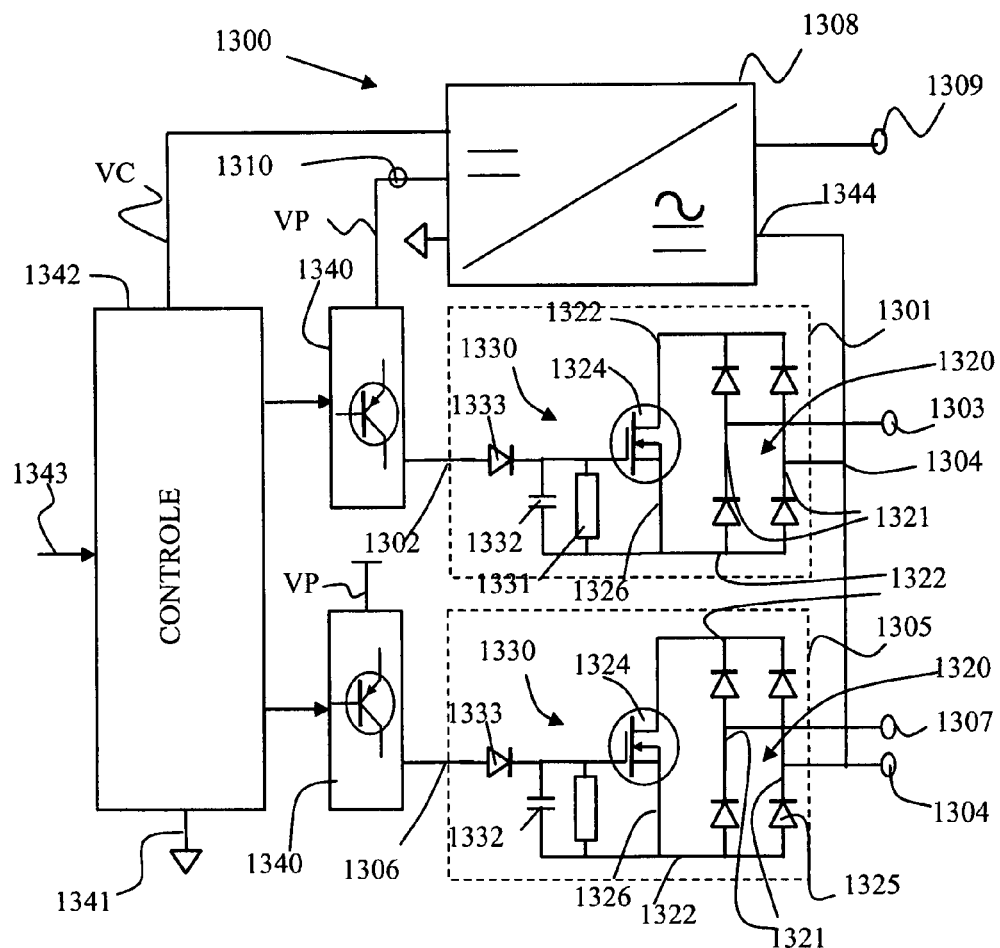
FIG. 11 represents a diagram of an auxiliary device according to a particular embodiment of the invention including electronic switching means.

An auxiliary device 1300 according to one embodiment of the invention is represented in diagram form in FIG. 11. In this diagram, the device comprises a first power semi-conductor module 1301 having a control input 1302, a first power output 1303 and a common second output 1304, and a second power semi-conductor module 1305 having a control input 1306, a first power output 1307 and a common second output 1304. The common second outputs of each module are therefore connected such as to be grouped together in a main common output 1304. The auxiliary device also comprises a power supply circuit 1308 comprising at least a third supply voltage input 1309 and a polarization voltage VP output 1310.

To avoid power supply circuit decoupling problems, in this device according to an embodiment of the invention, the power supply circuit supplies a polarization voltage VP on said polarization voltage output 13 10 when there is a first polarity enabling current to flow between said third input 1309 and said common output 1304.

In this device, the power semi-conductor modules 1301 and 1305 comprise:
current blocking means to block the current flow when there is a second polarity opposite to the first polarity between said first power output 1303, 1307 and said common output 1304, and
means for storing electrical polarization energy to command turn-on of said power semi-conductors during blocking of the power supply circuit current.

Each module comprises a rectifier bridge 1320 formed by four diodes having two AC terminals 1321 corresponding to the outputs 1303, 1304, 1307 of the modules 1301 and 1305 and DC terminals 1322 connected to power electrodes of an electronic power component 1324. Said current blocking means are formed by at least one diode 1325 of said rectifier bridge connected between a reference electrode 1326 of the power semi-conductor and the common second output 1304 of the power semi-conductor module. In this case, the polarization voltage VP is supplied by the power supply circuit when a positive voltage polarity is applied to the input 1309 and a negative voltage polarity is applied to the common second output 1304. The reference line 1326 of the power semi-conductors is the line corresponding to the reference electrode, i.e. the source or emitter depending on the type of power transistor used.

In the layout diagram of FIG. 11, each module comprises means 1330 for storing polarization voltage to command the power semi-conductor 1324 connected to a control electrode of said power semi-conductor. The means for storing are in this case formed by a RC circuit comprising a capacitor 1331 and a resistor 1332 connected in parallel and an anti-feedback series-mounted diode 1333. The capacitor stores an electric control power or voltage during a time that is predetermined by the values of the capacitor 1331 and of the resistor 1332. The means for storing are referenced to the reference electrode 1326 of the power semi-conductor, i.e. the source or emitter depending on the type of transistor used.

To improve control of the modules 1301 and 1305, an auxiliary device according to an embodiment of the invention comprises means 1340 for changing reference line to change a control signal reference line between a first input signal reference line 1341 and a second reference line dependent on the polarization voltage VP output 1310. In the layout diagram of FIG. 11, circuits 1340 change the control reference of the modules by applying the voltage VP without being referenced to the reference line 1341 of the control circuit 1342. The circuits 1340 thus perform electrical decoupling between the control circuit input reference line 1341 and the common output 1304.

The power supply circuit represented in FIG. 11 also comprises a fourth supply voltage input 1344 connected to said common output 1304 of the power semi-conductor modules, and means for supplying a power supply voltage VC to the control circuit 1342 for its own operation. A control input 1343 is connected to the control circuit, and said control circuit 1342 comprises control outputs to supply control signals to the power semi-conductor modules. Said control circuit 1342 thus receives control signals on at least one input 1343 and supplies control signals of said modules 1301 and 1305 via the reference line changing circuits 1340. In this embodiment, the reference lines 1341 of the control circuit 1342, of the polarization voltage VP, of the reference electrodes 1326 of the power semi-conductors 1324, and of the common output 1304 are at different electrical voltages.

FIGS. 12A to 12D illustrate examples of signals present in a device according to one embodiment of the invention. FIG. 12A shows a curve 1400 representative of the active state of a control signal on output from the control circuit 1342 to command the reference line changing circuits 1340. FIG. 12B shows a curve 401 representative of a voltage on control inputs 1302 or 1306 of the circuits 1301 or 1305 when the control signals are active. FIG. 12C shows a curve 1402 representative of signals on the means 1330 for storing polarization voltage for command of the power semi-conductor 1324 connected to a control electrode of said power semi-conductor. FIG. 12D shows a curve 1403 representative of an AC voltage between the third supply voltage input 1309 and a fourth supply voltage input 1344 connected to said common output 1304.

Between the times t0 and t1, a positive half-wave is applied between the input 1309 and the supply voltage input 1344 connected to said common output 1304. In this case, the output 1310 supplies a positive polarization voltage VP to the reference line changing circuits 1340 and to the means for storing if control is activated as in FIG. 12C. Control of the power semi-conductors 1324 is active, and they are therefore in an on state. Between the time t1 and a time t2, a negative half-wave is applied between the input 1309 and the supply voltage input 1344 connected to said common output 1304. During this half-wave, the output 1310 does not supply a polarization voltage VP. The signal of the curve 1401 representative of a voltage on control inputs 1302 or 1306 of the circuits 1301 or 1305 is low even if the control signals have to be active. The means for storing then maintain a control voltage on the control electrode of said power semi-conductor throughout the negative half-wave. During this half-wave, the switching current can flow in the power semi-conductors and the rectifier bridge whereas the supply or polarization voltage current is blocked. Then, during the time t2 and a time t3, a new positive half-wave enables the means for storing to be recharged as control of the power semi-conductor is still active.

Figure 13:
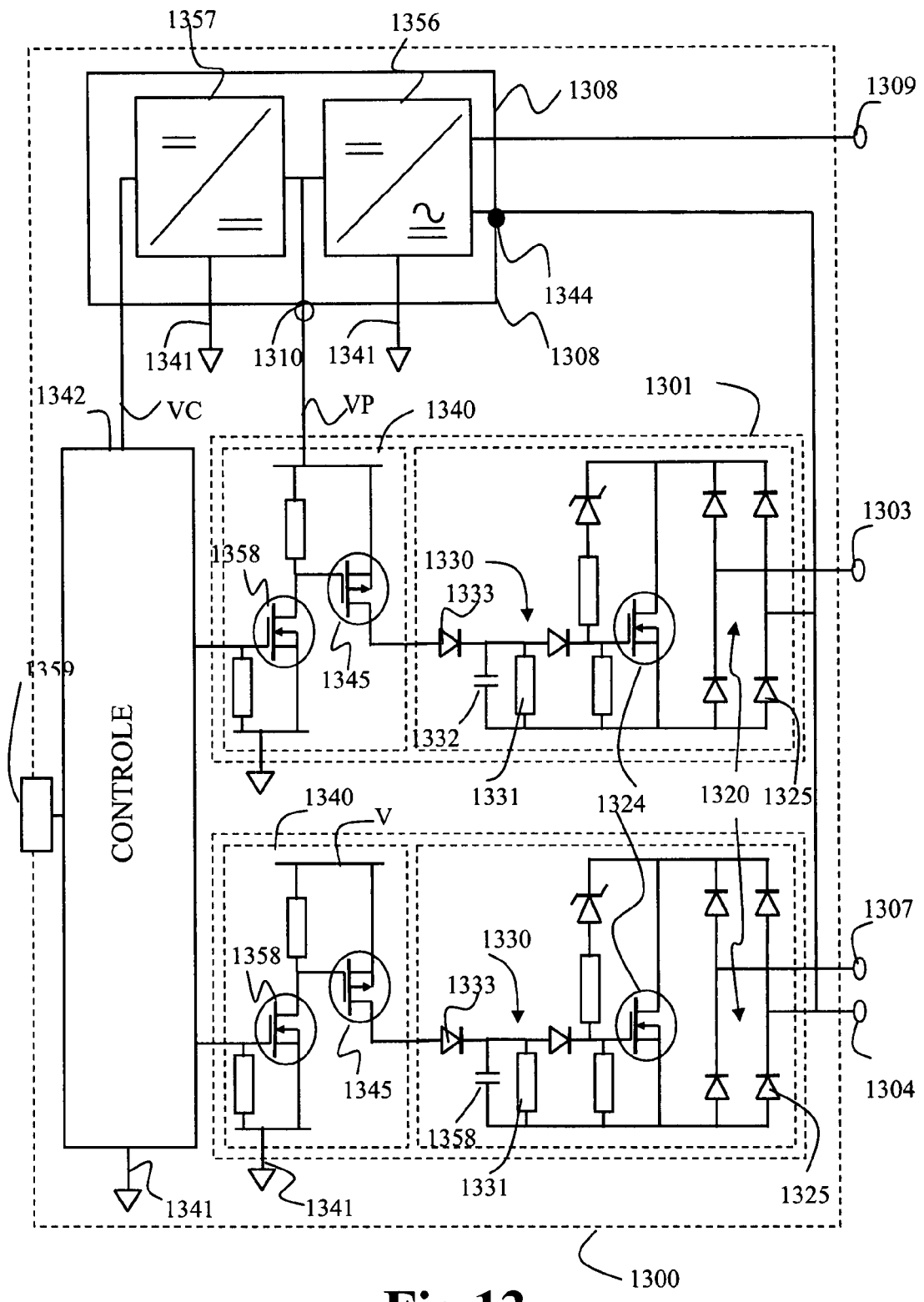
FIG. 13 represents a diagram of an auxiliary device according to another particular embodiment of the invention including electronic switching means.

FIG. 13 represents another diagram of an auxiliary device according to an embodiment of the invention. In this diagram, the power supply circuit is achieved in two parts. A first regulating circuit 1356 supplies the polarization voltage VP for reference changing and a second regulating circuit 1357 supplies the voltage VC for power supply of the control circuit 1342. The means 1340 for changing reference line comprise transistors 1358 controlled by the control circuit. The transistors 1358 have their sources or their emitters referenced at the reference line 1341 of the control circuit. The output electrode, the drain or collector, commands the transistor 1345 for reference changing. Advantageously, the transistors 1358 and 1345 are of different polarization type so that the transistor 1345 is referenced on the voltage VP and the transistor 1358 is referenced at the reference of the control circuit 1341 of different polarity from the voltage VP.

Preferably, decoupling means 1359 with electrical insulation are arranged between a control input and the control circuit. These decoupling means comprise at least one optic coupler and hermetic protection means.

In the lay-outs described above and shown in the figures, the transistors used are field effect transistors. However other types of transistors or electronic components can be used, for example bipolar transistors or insulated gate bipolar transistors called IGBT.

The means for changing reference line, the means for storing, and the modules can be achieved in grouped manner on one and the same electronic circuit or be separated over several interconnected circuits or boards.

The invention claimed is:

1. An auxiliary data transmission device for a circuit breaker, said device comprising a processing means comprising:
   a first input for receiving a first data item representative of a state of said circuit breaker;
   at least one command output for commanding transmission of a data item;
   a second input for receiving at least one second data item representative of an electrical fault or of an auxiliary command;
   an identification means for identifying an electrical fault or an auxiliary command in the second data item;
   an initialization means for initializing the at least one command output for commanding transmission of the first data item representative of a state of said circuit breaker according to the first data item and the second data item; and
   an adjoined switch for commanding transmission of the second data item when the second data item is representative of an auxiliary opening command of said adjoined switch, and for performing initialization of at least one command output when the second data item is representative of an auxiliary initialization command.

2. The device according to claim 1 wherein the identification means is for identifying an electrical fault causing opening of the main contacts of a circuit breaker.

3. The device according to claim 1 wherein the signals carrying the second data item are in the form of a frame comprising a pulse, the duration of which pulse is representative of the data carried by said signals.

4. The device according to claim 1 wherein the processing means is also for responding to receipt of a fault-indicating transmission for initializing a change of state of a circuit breaker by
   commanding transmission of the second data item when the second data item is representative of an electrical fault corresponding to a fault causing opening of the main contacts of the circuit breaker; and
   performing initialization of the at least one command output when the first data item is representative of subsequent closing of the main contacts of said circuit breaker.

5. The device according to claim 4 wherein the second data item is representative of an electrical fault of a thermal and/or differential type.

6. The device according to claim 4 wherein the processing means comprises two command outputs for commanding data transmission on two static contacts enabling a data item representative of an electrical fault of a thermal type and a data item representative of an electrical fault of a differential type to be distinctively transmitted.

7. The device according to claim 1 wherein upon receipt of a fault-indicating transmission, the processing means is for initializing tripping of the trip device of a circuit breaker by
commanding transmission of the second data item when the second data item is representative of an electrical fault; and
performing initialization of the at least one command output when the second data item is representative of an auxiliary initialization command.

8. The device according to claim 1 comprising an adjustment means for adjusting the time delay of the auxiliary adjoined switch opening command.

9. The device according to claim 8 wherein the first input is connected to the adjustment means for receiving data representative of the time delay.

10. The device according to claim 1 wherein the processing means comprises a coupling circuit with a trip device of said circuit breaker for receiving signals carrying the second data item representative of an electrical fault or of an auxiliary command, the second input being connected to said coupling circuit.

11. The device according to claim 10 wherein the coupling circuit comprises an optic coupler and hermetic protection means.

12. The device according to claim 1 comprising a switching module comprising power outputs, said switching module being connected to the at least one command output for switching at least one static contact and for transmitting at least one of said data items to said contact.

13. The device according to claim 1 wherein the processing means comprises:
at least one power semi-conductor module having a control input, a first output and a common second output; and
a power supply circuit comprising at least one third supply voltage input and a polarization voltage output for controlling said control input of at least one semi-conductor module;
wherein the power supply circuit is for supplying a polarization voltage to said polarization voltage output when there is a first voltage polarity between said third voltage input and said common output enabling a current flow, said power supply comprising a fourth supply voltage input connected to said common output of the power semi-conductor modules, and means for supplying a supply voltage to a control circuit supplying control signals of said modules;
wherein the at least one power semi-conductor module comprises:
a current blocking unit for blocking a current flow from the power supply circuit when there is a second polarity opposite to the first polarity between said third input and said common output; and
at least one energy storing unit for storing electrical polarization energy for commanding turn-on of said power semi-conductors during power supply circuit current blocking;
wherein the processing means comprises means for changing the reference line of control signals between a first input signal reference line and a second reference line dependent on the polarization voltage output.

14. The device according to claim 13 wherein each power semi-conductor module comprises a rectifier bridge having two AC terminals corresponding to the outputs of the modules and DC terminals connected to power electrodes of an electronic power component, said current blocking unit comprising at least one diode of said rectifier bridge connected between a reference power electrode of the power semi-conductor and a common second output of the power semi-conductor module.

15. The device according to claim 13 wherein each power semi-conductor module comprises an energy storing unit for storing polarization voltage for command of power semi-conductors connected to a power semi-conductor control electrode.

16. An auxiliary unit of an electrical circuit breaker comprising:
an auxiliary data transmission device according to claim 1; and
a transmission device for transmitting the state of the circuit breaker when separated from said auxiliary data transmission device and coupled to the first input.

17. The auxiliary unit according to claim 16 wherein the transmission device for transmitting the state of the circuit breaker comprises an electrical contact actuatable by a mechanism of the circuit breaker.

18. The auxiliary unit according to claim 16 wherein the transmission device for transmitting the state of the circuit breaker is in an electrical terminal block connected to the static contacts of said auxiliary device.

19. The auxiliary unit according to claim 18 wherein the electrical terminal block will fit into at least one compartment of said circuit breaker.

20. An electrical circuit breaker comprising:
an electronic trip device for triggering opening of the main contacts of said circuit breaker in response to at least one type of electrical fault; and
an auxiliary unit coupled with said electronic trip device;
wherein said auxiliary unit is a unit according to claim 16, coupled to the trip device by a coupling circuit of the auxiliary data transmission device of said auxiliary unit.

21. The device according to claim 1 wherein the identification module is for identifying an electrical fault which does not cause opening of the main contacts of the circuit breaker.

* * * * *